(12) United States Patent
Kim et al.

(10) Patent No.: US 12,408,355 B2
(45) Date of Patent: Sep. 2, 2025

(54) METAL-INSULATOR-METAL CAPACITOR

(71) Applicant: SAMSUNG ELECTRONICS CO., LTD., Suwon-si (KR)

(72) Inventors: Jihyung Kim, Suwon-si (KR); Jeonghoon Ahn, Suwon-si (KR); Jaehee Oh, Suwon-si (KR); Shaofeng Ding, Suwon-si (KR); Wonji Park, Suwon-si (KR); Jegwan Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/603,529

(22) Filed: Mar. 13, 2024

(65) Prior Publication Data
US 2024/0222421 A1    Jul. 4, 2024

Related U.S. Application Data

(62) Division of application No. 17/559,176, filed on Dec. 22, 2021, now Pat. No. 11,955,509.

(30) Foreign Application Priority Data

May 25, 2021 (KR) ........................ 10-2021-0066797

(51) Int. Cl.
    *H01L 23/522*   (2006.01)
    *H10D 1/00*     (2025.01)
    *H10D 1/68*     (2025.01)

(52) U.S. Cl.
    CPC ......... *H10D 1/694* (2025.01); *H01L 23/5223* (2013.01); *H10D 1/042* (2025.01); *H10D 1/714* (2025.01)

(58) Field of Classification Search
    CPC ...... H01L 23/5223; H10D 1/694; H10D 1/42; H10D 1/714; H10D 1/692
    See application file for complete search history.

(56) References Cited

U.S. PATENT DOCUMENTS

| 6,430,028 B1 | 8/2002 | Kar-Roy et al. |
| 10,290,701 B1 * | 5/2019 | Chang ................. H01L 23/5223 |

(Continued)

FOREIGN PATENT DOCUMENTS

| JP | 1999243177 | 9/1999 |
| JP | 2017199862 | 11/2017 |

(Continued)

OTHER PUBLICATIONS

Office Action in Korean Appln. No. 10-2021-0066797, mailed on Jan. 21, 2025, 14 pages (with English translation).

*Primary Examiner* — Omar F Mojaddedi
(74) *Attorney, Agent, or Firm* — Fish & Richardson P.C.

(57) ABSTRACT

A metal-insulator-metal capacitor includes a first electrode disposed in a first region of an upper surface of a substrate, a second electrode covering the first electrode and extending to a second region surrounding an outer periphery of the first region, a third electrode covering the second electrode and extending to a third region surrounding an outer periphery of the second region, a first dielectric layer disposed between the first electrode and the second electrode to cover an upper surface and a side surface of the first electrode and extending to the second region, and a second dielectric layer disposed between the second electrode and the third electrode to cover an upper surface and a side surface of the second electrode and extending to the third region and in contact with the first dielectric layer.

15 Claims, 7 Drawing Sheets

(56) References Cited

U.S. PATENT DOCUMENTS

| | | |
|---|---|---|
| 2009/0108404 A1 | 4/2009 | Kageyama |
| 2010/0224960 A1 | 9/2010 | Fischer |
| 2014/0159200 A1 | 6/2014 | Loke et al. |
| 2015/0357397 A1* | 12/2015 | Zhou .................. H10D 1/68 |
| | | 257/532 |
| 2015/0357400 A1 | 12/2015 | Furuhashi et al. |
| 2018/0190761 A1 | 7/2018 | Chiang et al. |
| 2018/0308635 A1* | 10/2018 | Chen ..................... H01G 4/30 |
| 2019/0305078 A1* | 10/2019 | Wu ..................... H10D 1/042 |
| 2020/0235087 A1* | 7/2020 | Ding .................. H01L 23/5228 |
| 2020/0350248 A1* | 11/2020 | Park .................. H01L 23/5226 |

FOREIGN PATENT DOCUMENTS

| | | |
|---|---|---|
| KR | 1020000044611 | 7/2000 |
| KR | 1020040034318 | 4/2004 |
| KR | 1020050069671 | 7/2005 |
| KR | 1020150139772 | 12/2015 |
| KR | 10-2017-0009602 A | 1/2017 |
| KR | 10-2020-0091192 A | 7/2020 |
| KR | 10-2020-0128315 A | 11/2020 |

* cited by examiner

METAL-INSULATOR-METAL CAPACITOR

CROSS TO REFERENCE TO RELATED APPLICATION(S)

This is a divisional of U.S. non-provisional patent application Ser. No. 17/599,176, filed Dec. 22, 2021, which claims benefit of priority under 35 U.S.C. § 119 to Korean Patent Application No. 10-2021-0066797, filed on May 25, 2021 in the Korean Intellectual Property Office, the disclosure of which is incorporated herein by reference in its entirety.

TECHNICAL FIELD

Example embodiments of the present disclosure relate to a metal-insulator-metal capacitor.

BACKGROUND

Semiconductor devices based on Bipolar, BiCMOS and CMOS techniques may require integrated capacitors having high voltage linearity, and low parasitic capacitance. However, a general MOS capacitor may have issues in that voltage linearity may be low due to a space charge region for voltage induction, and also, a large amount of parasitic capacitance may be present therein.

To address the issues above, a metal-insulator-metal capacitor may be used. Such a metal-insulator-metal capacitor may mainly be used to store electrical charges in various semiconductor devices such as a mixed-signal product and an analog product.

SUMMARY

Some example embodiments of the present disclosure provide metal-insulator-metal capacitors having improved reliability and yield.

In an example embodiment of the present disclosure, a metal-insulator-metal capacitor includes a first electrode, a second electrode, a third electrode, a first dielectric layer, and a second dielectric layer. The first electrode is in contact with an upper surface of a substrate and disposed in a first region of the upper surface. The second electrode covers the first electrode and extends to a second region surrounding an outer periphery of the first region. The third electrode covers the second electrode and extends to a third region surrounding an outer periphery of the second region. T first dielectric layer is disposed between the first electrode and the second electrode to cover an upper surface and a side surface of the first electrode and extends to the second region of the upper surface of the substrate. The second dielectric layer is disposed between the second electrode and the third electrode to cover an upper surface and a side surface of the second electrode and extends to the third region of the upper surface of the substrate and is in contact with the first dielectric layer.

In an example embodiment of the present disclosure, a metal-insulator-metal capacitor includes first to nth electrodes stacked on a substrate. The nth electrode covers an upper surface and a side surface of the n−1 electrode stacked therebelow. The metal-insulator-metal capacitor also includes first to n−1th dielectric layers interposed between the first to nth electrodes, and covering upper surfaces and side surfaces of first to n−1th electrodes, respectively. The first dielectric layer is in contact with the substrate. Second to n−1 dielectric layers have regions in contact with first to n−2th dielectric layers stacked therebelow, respectively. The nth electrode has first to n−1th bent portions formed in a staircase shape in an edge region thereof.

In an example embodiment of the present disclosure, a metal-insulator-metal capacitor includes a first electrode disposed on an upper surface of a substrate, a second electrode covering an upper surface and a side surface of the first electrode, a third electrode covering a side surface and an upper surface of the second electrode, a first dielectric layer interposed between the first electrode and the second electrode, and a second dielectric layer interposed between the second electrode and the third electrode. An interior angle between the upper surface and the side surface of each of the first electrode, the second electrode and the third electrode is in a range of 90° to 135°.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
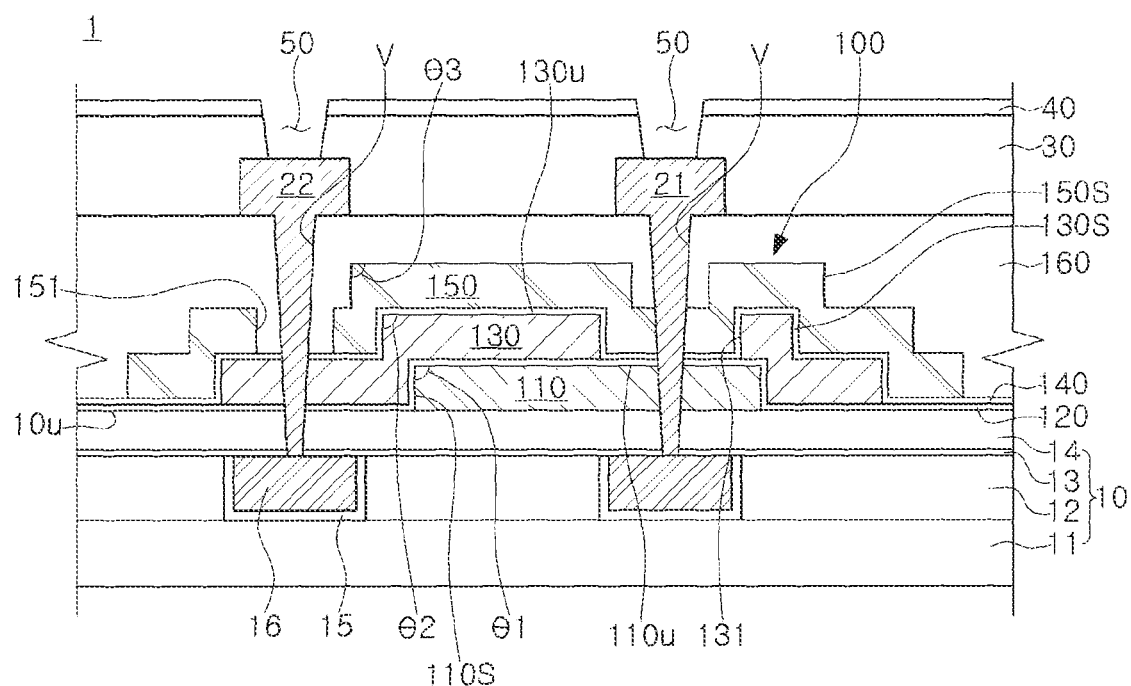
FIG. 1 is a cross-sectional diagram illustrating a metal-insulator-metal capacitor according to an example embodiment of the present disclosure.

Hereinafter, example embodiments of the present disclosure will be described as follows with reference to the accompanying drawings.

Terminology used herein to describe relative locational relationships between elements shown in the drawings should be considered in the context of what is shown in the drawings. For example, a description of a first element (e.g., an electrode or a dielectric layer) covering a second element (e.g., an electrode or a dielectric layer) may be taken to mean that the first element substantially or entirely overlaps at least one surface (e.g., an upper surface and perhaps one or more side surfaces) of the second element. A description of a first element (e.g., an electrode or a dielectric layer) overlapping a second element (e.g., an electrode or a dielectric layer) may be taken to mean that a view of the second element would be obstructed by the first element from one or more viewpoints. Descriptions of a first element being on a second element may be taken to mean that the first element is over the second element when an apparatus or device that includes the first element and the second element is arranged in practice with the same orientation as shown in the referenced drawing.

Figure 2:
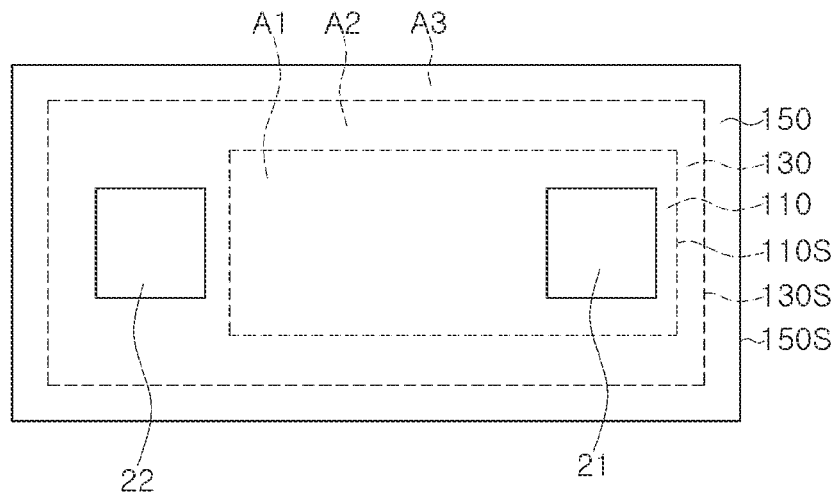
FIG. 2 is a plan diagram illustrating a metal-insulator-metal capacitor according to an example embodiment of the present disclosure.

Referring to FIG. 1 and FIG. 2, a metal-insulator-metal capacitor 100 according to an example embodiment will be described. FIG. 1 is a cross-sectional diagram illustrating a metal-insulator-metal capacitor 100 according to an example embodiment. In FIG. 1, the metal-insulator-metal capacitor 100 is included in a semiconductor device 1. FIG. 2 is a plan diagram illustrating a metal-insulator-metal capacitor according to an example embodiment.

In the semiconductor device 1, a metal-insulator-metal capacitor 100 may be disposed on a substrate 10. A cover layer 160 is disposed to covers the metal-insulator-metal capacitor 100. The first electrode 110, the second electrode 130, and the third electrode 150 of the metal-insulator-metal capacitor 100 may be electrically connected by the first via electrode 21 and the second via electrode 22. A passivation layer 30 and a protective layer 40 may be stacked on the first via electrode 21 and the second via electrode 22. A hole 50 penetrates through the passivation layer 30 and the protective layer 40 and is connected to the first via electrode 21 and the second via electrode 22. The first via electrode 21 and the second via electrode 22 may be connected to the substrate 10 through the via hole V penetrating through the cover layer 160, the first electrode 110, the second electrode 130, and the third electrode 150, and the first dielectric layer 120 and the second dielectric layer 140. The first via electrode 21 and the second via electrode 22 may be electrically connected to the first electrode 110, the second electrode 130, and the third electrode 150. In an example embodiment, the first via electrode 21 is electrically connected to the first electrode 110 and the third electrode 150, and the second via electrode 22 is electrically connected to the second electrode 130. Also, in an example embodiment, the first electrode 110, the second electrode 130, and the third electrode 150 may be disposed. Example embodiments are not limited to the details described herein. For example, four or more electrodes may be disposed in an example embodiment.

In the substrate 10, a wiring region 12, a first insulating layer 13, and a second insulating layer 14 may be disposed on the semiconductor substrate 11.

The semiconductor substrate 11 may include, for example, a semiconductor element such as silicon or germanium (Ge), or a compound semiconductor such as silicon carbide (SiC), gallium arsenide (GaAs), indium arsenide (InAs), or indium phosphide (InP). The semiconductor substrate 11 may have a silicon on insulator (SOI) structure. A wiring region 12 for forming wiring may be disposed on the semiconductor substrate 11. A wiring including a conductive layer 16 and a barrier layer 15 may be disposed in the wiring region 12. The conductive layer 16 may be formed of a composite such as Ti/TiN/Al—Cu/Ti/TiN.

A first insulating layer 13 and a second insulating layer 14 may be disposed on the semiconductor substrate 11. The first insulating layer 13 and the second insulating layer 14 may be formed of different insulating materials. The first insulating layer 13 may include silicon nitride (SiN) and silicon oxynitride (SiON). The second insulating layer 14 may be formed of silicon oxide ($SiO_2$).

The metal-insulator-metal capacitor 100 may be disposed on the substrate 10, and may include the first electrode 110, the second electrode 130, and the third electrode 150 and the first dielectric layer 120 and the second dielectric layer 140.

The first electrode 110, the second electrode 130, and the third electrode 150 may be stacked in order on the substrate 10. The first electrode 110, the second electrode 130, and the third electrode 150 may be formed of the same conductive material, but may be formed of different conductive materials in example embodiments. The conductive material may include a metal such as aluminum (Al), copper (Cu), nickel (Ni), tungsten (W), platinum (Pt) and gold (Au), a metal silicide, a metal nitride, a metal oxide, polysilicon, conductive carbon, or a combination thereof.

Referring to FIG. 2, the first electrode 110 may be disposed in the first region A1 of the upper surface 10U of the substrate 10. The first electrode 110 may be formed such that a side surface 110S and an upper surface 110U may have an interior angle (hereinafter, defined as a "first interior angle $\theta1$") of about 90° to about 135°.

The second electrode 130 may be disposed to overlap the first electrode 110 in the first region A1, and may extend to the second region A2 disposed around the first region A1 and may be in contact with the upper surface 10U of the substrate 10. Accordingly, the second electrode 130 may entirely cover the upper surface 110U and the side surface 110S of the first electrode 110. At least one instance of a first groove portion 131 may be formed in the second electrode 130 in the first region A1. The first via electrode 21 may be spaced apart from the internal side wall of the first groove portion 131, may penetrate the first groove portion 131, and may be in contact with the first electrode 110 and the second electrode 130. Accordingly, the first via electrode 21 may be insulated from the second electrode 130 and may be connected to the first electrode 110 and the third electrode 150. The second electrode 130 may be stacked on the first electrode 110, and may have a bent region bent in a staircase shape in a region in contact with the side surface 110S of the first electrode 110. The interior angle of the bent region (hereinafter, defined as a "second interior angle $\theta2$") may be the same as the first interior angle $\theta1$, or may be greater by about 10° degrees or less. In other words, an angle difference $\theta2-\theta1$ between the second interior angle $\theta2$ and the first interior angle $\theta1$ may be in a range from about 0° to about 10°.

The third electrode 150 may be disposed to overlap the second electrode 130 in the first region A1 and the second region A2, may extend to the third region A3 disposed around the second region A2, and may overlap the substrate 10. Accordingly, the second electrode 130 may entirely cover the first electrode 110, and the third electrode 150 may entirely cover the second electrode 130. In the third electrode 150, at least one instance of a second groove portion 151 may be formed in the second region A2. The second via electrode 22 may be spaced apart from the internal side wall of the second groove portion 151, may penetrate the second groove portion 151, and may be in contact with the second electrode 130. The third electrode 150 may be stacked on the second electrode 130, and may have a bent region bent in a staircase shape in a region in contact with the side surface 130S of the second electrode 130. The interior angle of the bent region (hereinafter, defined as a "third interior angle $\theta3$") may be the same as the second interior angle $\theta2$, or may be greater by about 10° degrees or less. In other words, an angle difference $\theta3-\theta2$ between the third interior angle $\theta3$ and the second interior angle $\theta2$ may be in a range from about 0° to about 10°.

The first dielectric layer 120 and the second dielectric layer 140 may be interposed between the first electrode 110, the second electrode 130, and the third electrode 150. The first dielectric layer 120 and the second dielectric layer 140 may be formed of a dielectric material including silicon oxide, silicon nitride, silicon oxynitride, a high-K dielectric, or a combination thereof. The first dielectric layer 120 and the second dielectric layer 140 may both include the same dielectric material.

The first dielectric layer 120 may be interposed between the first electrode 110 and the second electrode 130. The first dielectric layer 120 may directly cover the upper surface 110U and the side surface 110S of the first electrode 110 in the first region A1, may extend to the second region A2, and may be in direct contact with the upper surface 10U of the substrate 10. The first dielectric layer 120 may cover the upper surface 110U and the side surface 110S of the first electrode 110 with a uniform thickness. Therefore, since the first dielectric layer 120 may allow the first electrode 110 and the second electrode 130 to be spaced apart from each other by a predetermined distance, the surface shape of the first electrode 110 may be transferred to the second electrode 130 stacked on the first electrode 110, such that the bent region of the second electrode 130 bent in a staircase shape may be formed in a region in contact with the side surface 110S of the first electrode 110. This is shown by the contour of the second electrode 130 to the left of the label for the second electrode 130 in FIG. 1, around where the first interior angle θ1 and the second interior angle θ2 are shown.

The second dielectric layer 140 may be interposed between the second electrode 130 and the third electrode 150. The second dielectric layer 140 may directly cover the upper surface 130U and the side surface 130S of the second electrode 130 in the first region A1 and the second region A2, may extend to the third region A3, and may be in direct contact with the first dielectric layer 120. The second dielectric layer 140 may be disposed to directly cover the upper surface 130U and the side surface 130S of the second electrode 130 with a uniform thickness. Accordingly, since the second dielectric layer 140 may allow the second electrode 130 and the third electrode 150 to be spaced apart from each other by a predetermined distance, the surface shape of the second electrode 130 may be transferred to the third electrode 150 stacked on the second electrode 130, such that the bent region of the third electrode 130 bent in a staircase shape may be formed in a region in contact with the side surface 130S of the second electrode 130. This is shown by the contour of the third electrode 150 to the right of the first via electrode 21 in FIG. 1.

In the metal-insulator-metal capacitor 100 in an example embodiment, the first electrode 110, the second electrode 130, and the third electrode 150 may be stacked in order on the substrate 10. An upper electrode may cover a lower electrode, and damages to the lower electrode and/or the lower dielectric layer caused by misalignment of electrode patterns may be prevented in a process of etching and patterning the upper electrode. Also, since a dielectric layer interposed between the upper electrode and the lower electrode covers the side surface of the lower electrode, the process may be shortened as compared to the example in which a spacer is disposed on the side surface of the lower electrode and the dielectric layer is configured to cover the surface of the spacer.

Figure 3:
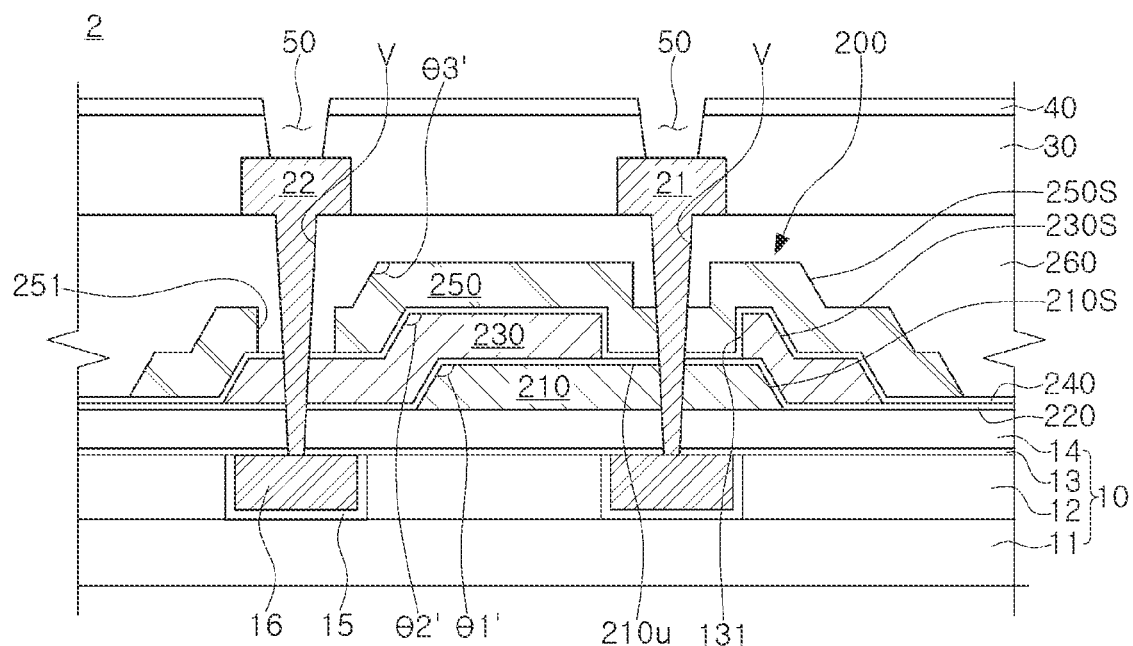
FIG. 3 is a cross-sectional diagram illustrating a metal-insulator-metal capacitor according to an example embodiment of the present disclosure.

A metal-insulator-metal capacitor 200 will be described according to an example embodiment with reference to FIG. 3. FIG. 3 is a cross-sectional diagram illustrating a metal-insulator-metal capacitor 200 according to an example embodiment. In FIG. 3 the metal-insulator-metal capacitor 200 is included in a semiconductor device 2. In the semiconductor device 2, the metal-insulator-metal capacitor 200 may be disposed on a substrate 10, a cover layer 260 is disposed to cover the metal-insulator-metal capacitor 200, and the first electrode 210, the second electrode 230, and the third electrode 250 of the metal-insulator-metal capacitor 200 may be electrically connected to each other by first via electrode 21 and the second via electrode 22. The metal-insulator-metal capacitor 200 is again disposed on the substrate 10, and also includes the first dielectric layer 220 and the second dielectric layer 240.

In the metal-insulator-metal capacitor 200 in an example embodiment, each side surface 210S, 230S, and 250S of the first electrode 210, the second electrode 230, and the third electrode 250 may have an inclined surface, differently from the metal-insulator-metal capacitor 100 described in the aforementioned embodiment. The metal-insulator-metal capacitor 200 may be the same as the metal-insulator-metal capacitor 100 in FIG. 1 and FIG. 2 other than the above configuration. Thus, overlapping descriptions described with reference to FIG. 1 and FIG. 2 will not be provided.

FIG. 3 illustrates a semiconductor device 1 in which a metal-insulator-metal capacitor 200 is employed according to an example embodiment.

In the metal-insulator-metal capacitor 200 in an example embodiment, a first interior angle θ1' at which the side surface 210S and the upper surface 210U of the first electrode 210 meet each other may be formed as an obtuse angle greater than 90°, such that the side surface 210S may have an inclined surface. Since the first interior angle θ1' of the first electrode 210 is formed as an obtuse angle, the second interior angle θ2' of the second electrode 230 stacked on the first electrode 210 may be formed as an obtuse angle to correspond to the first interior angle θ1' of the first electrode 210. Also, since the second interior angle θ2' of the second electrode 230 is formed as an obtuse angle, a third interior angle θ3' of the third electrode 250 stacked on the second electrode 230 may also be formed as an obtuse angle to correspond to the second interior angle θ2' of the second electrode 230.

Figure 4:
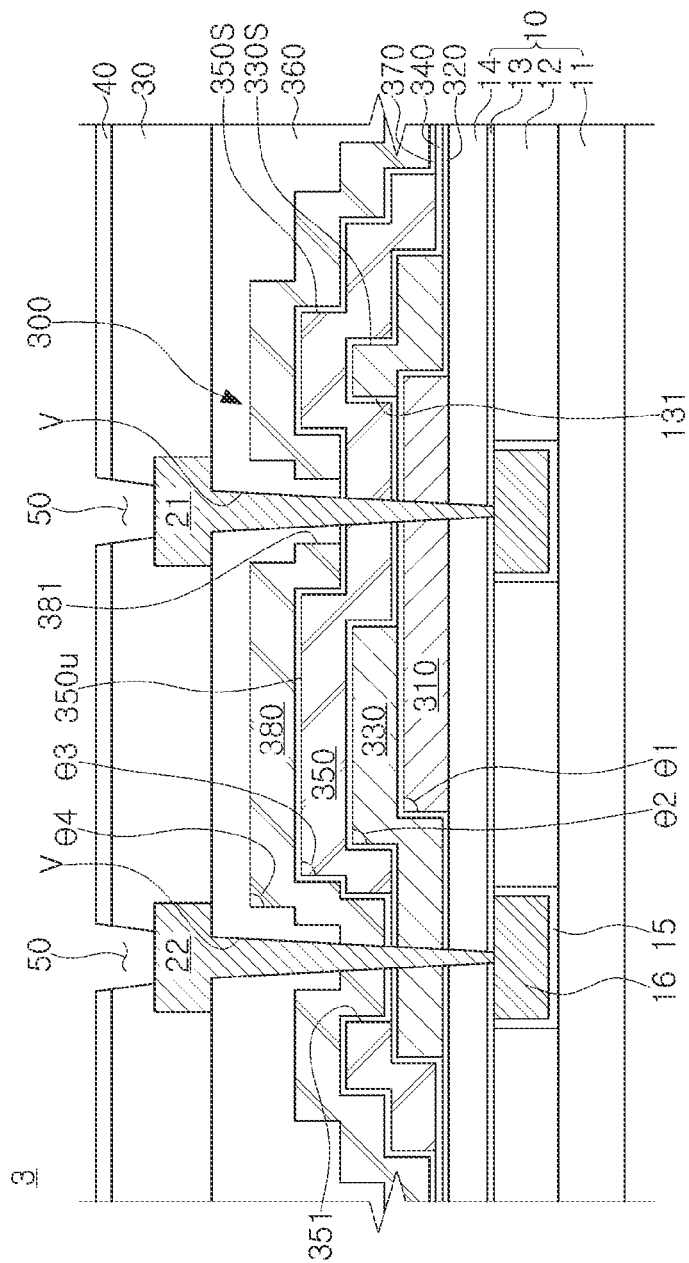
FIG. 4 is a cross-sectional diagram illustrating a metal-insulator-metal capacitor according to an example embodiment of the present disclosure.

A metal-insulator-metal capacitor 300 will be described according an example embodiment. FIG. 4 is a cross-sectional diagram illustrating a metal-insulator-metal capacitor 300 according to an example embodiment. In FIG. 4, the metal-insulator-metal capacitor 300 is included in a semiconductor device 3. In the semiconductor device 3, the metal-insulator-metal capacitor 300 may be disposed on a substrate 10. A cover layer 360 is disposed to cover the metal-insulator-metal capacitor 300. The first electrode 310, the second electrode 330, and the third electrode 350 of the metal-insulator-metal capacitor 300 may be electrically connected to each other by the first via electrode 21 and the second via electrode 22.

In the metal-insulator-metal capacitor 300 in an example embodiment, a third dielectric layer 370 and a fourth electrode 380 may be further disposed on the first electrode 310, the second electrode 330, and the third electrode 350, differently from the aforementioned example embodiments. The metal-insulator-metal capacitor 300 may have the same configuration as or a similar configuration to that of the metal-insulator-metal capacitor 100 in FIG. 1 and FIG. 2. Thus, overlapping descriptions described with reference to FIG. 1 and FIG. 2 will not be provided.

The fourth electrode 380 may be disposed to entirely cover the upper surface 350U and the side surface 350S of the third electrode 350. The fourth electrode 380 may be stacked on the third electrode 350 and may have a bent region bent in a staircase shape in a region in contact with the side surface 350S of the third electrode 350. The bent region of the fourth electrode 380 is shown to the right of the first via electrode 21 in FIG. 4, and is shown with a contour to have three bent portions, or the same number of bent portions as the number of electrodes to which the fourth electrode 380 is conformed. The fourth electrode 380 may be formed of the same conductive material as that of the first electrode 310, the second electrode 330, and the third electrode 350, but may be formed of a different conductive material in example embodiments. The conductive material may include a metal such as copper (Cu) and tungsten (W), a metal silicide, a metal nitride, a metal oxide, polysilicon, conductive carbon, or a combination thereof. A third groove portion 381 having a width greater than that of the second via electrode 22 may be formed in a region of the fourth electrodes 380 penetrated by the second via electrode 22, such that the second via electrode 22 and the fourth electrode 380 may not be connected to each other. Accordingly, the first via electrode 21 may be electrically connected to the first electrode 310 and the third electrode 350, and the second via electrode 22 may be connected to the second electrode 330 and the fourth electrode 380.

The third dielectric layer 370 may include silicon oxide, silicon nitride, silicon oxynitride, a high-K dielectric, or a combination thereof, similarly to the first dielectric layer 320 and the second dielectric layer 340. The third dielectric layer 370 may be interposed between the third electrode 350 and the fourth electrode 380.

As described above with respect to embodiments shown in FIG. 1, FIG. 2, FIG. 3 and FIG. 4, a metal-insulator-metal capacitor may include first to nth electrodes stacked on a substrate. The first electrode may be any of the first electrode 110, the first electrode 210, or the first electrode 310 described in these embodiments, and the nth electrode may be any of the third electrode 150, the third electrode 250 or the fourth electrode 380 described in these embodiments. An n−1 electrode may be any of the electrodes with the second highest label number in respective embodiments, such as the third electrode 350 in the embodiment of FIG. 4 or the second electrode 130 or the second electrode 230 in other embodiments.

In terms of electrodes labelled 1st to nth electrodes, the nth electrode may cover an upper surface and a side surface of the n−1 electrode stacked therebelow. First to n−1th dielectric layers are interposed between the first to nth electrodes, and cover upper surfaces and side surfaces of the first to n−1th electrodes, respectively. A first dielectric layer such as the first dielectric layer 320 in the embodiment of FIG. 4 is in contact with the substrate. Second to n−1th dielectric layers have regions in contact with first to n−2th dielectric layers stacked therebelow, respectively. An example of the n−1th dielectric layer is the third dielectric layer 370 in the embodiment of FIG. 4.

In characterizing the teachings of these embodiments using labels of 1st to nth electrodes, a relationship can be seen wherein the nth electrode has first to n−1th bent portions formed in a staircase shape in an edge region thereof. This is best seen in FIG. 4 to the right of the first via electrode 21, wherein the contour of the fourth electrode 380 has three bent portions in a staircase shape in an edge region, though a similar relationship can be seen in FIG. 1 and FIG. 3. The contour of the third electrode 350 in this edge region in FIG. 4 has two bent portions in a staircase shape. The contour of the second electrode 330 in this edge region in FIG. 4 has one bent portion in a staircase shape. An interior angle between the upper surface and the side surface of the nth electrode may be in a range of 90° to 135°. For example, the interior angles shown in FIG. 1 and FIG. 4 are approximately 90°, whereas the interior angles shown in FIG. 3 are approximately 135°. An interior angle between the upper surface and the side surface of the nth electrode and an interior angle between the upper surface and the side surface of the n−1th electrode may have an angle difference of 0° to 10°, which is to say that the electrodes are fitted to substantially conform to the electrodes immediately below.

Moreover, the nth electrode may have a size larger than a size of the n−1th electrode. Each of the first to n−1th dielectric layers may have a substantially uniform thickness. For the nth electrode with the first to n−1th bent portions formed in a staircase shape in an edge region, the first to n−1th bent portions may have a substantially equal difference therebetween, such as by having substantially equal interior angles.

Moreover, the nth electrode may have at least one groove portion in which the n−1th dielectric layer is disposed on a bottom surface thereof in a region overlapping the n−1th electrode. Examples of groove portions include the first groove portion 131, the second groove portion 151, and the third groove portion 381.

Accordingly, whether the nth electrode in the above descriptions is seen as the fourth electrode 380 in FIG. 4 or the third electrode 150 in FIG. 1 and/or the third electrode 250 in FIG. 3, the characteristics of some of the relative sizes and angle differences may be seen as scalable in embodiments with different numbers of total electrodes and dielectric layers.

A method of manufacturing a package substrate will be described with reference to FIG. 5, FIG. 6, FIG. 7, FIG. 8, FIG. 9, FIG. 10, FIG. 11, and FIG. 12. FIG. 5, FIG. 6, FIG. 7, FIG. 8, FIG. 9, FIG. 10, FIG. 11 and FIG. 12 are each cross-sectional diagrams illustrating a method of manufacturing the metal-insulator-metal capacitor 100 illustrated in FIG. 1.

Figure 5:
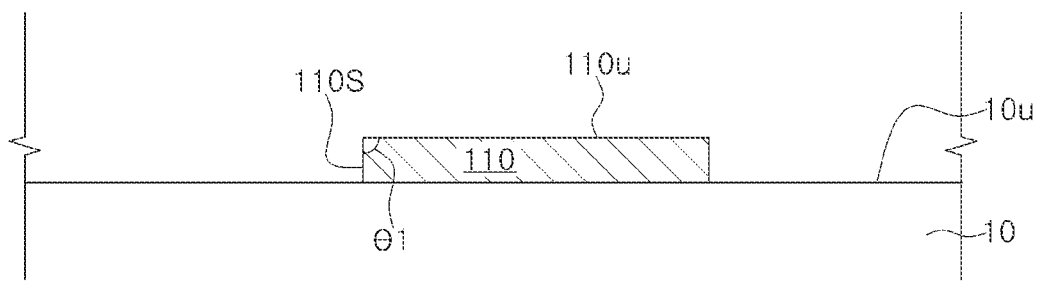
FIG. 5, FIG. 6, FIG. 7, FIG. 8, FIG. 9, FIG. 10, FIG. 11 and FIG. 12 are each cross-sectional diagrams illustrating a method of manufacturing the metal-insulator-metal capacitor illustrated in FIG. 1.

Referring to FIG. 5, a first electrode 110 may be formed on an upper surface 10U of a substrate 10. The first electrode 110 may be formed by depositing a conductive material on the upper surface 10U of the substrate 10. The conductive material may include a metal such as aluminum (Al), copper (Cu), nickel (Ni), tungsten (W), platinum (Pt) and gold (Au), metal silicide, metal nitride, metal oxide, polysilicon, conductive carbon, or a combination thereof. The side surface 110S of the first electrode 110 may be formed to have a first interior angle $\theta 1$ of about 90° to about 135° with the upper surface 110U.

Figure 6:
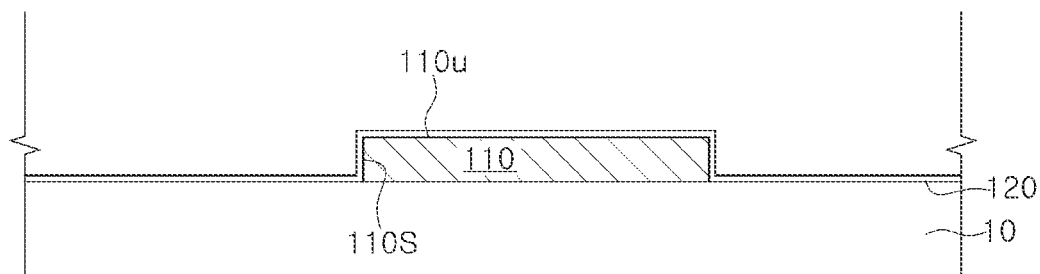

Referring to FIG. 6, the first dielectric layer 120 may be formed to cover the first electrode 110. The first dielectric layer 120 may be formed to cover the upper surface 110U and the side surface 110S of the first electrode 110. The first dielectric layer 120 may include silicon oxide, silicon nitride, silicon oxynitride, a high-K dielectric, or a combination thereof. The first dielectric layer 120 may be conformally formed on the first electrode 110 by a predetermined thickness. Accordingly, in a subsequent process of forming the second electrode 130, an exterior shape of the first electrode 110 may be transferred to the second electrode 130.

Figure 7:
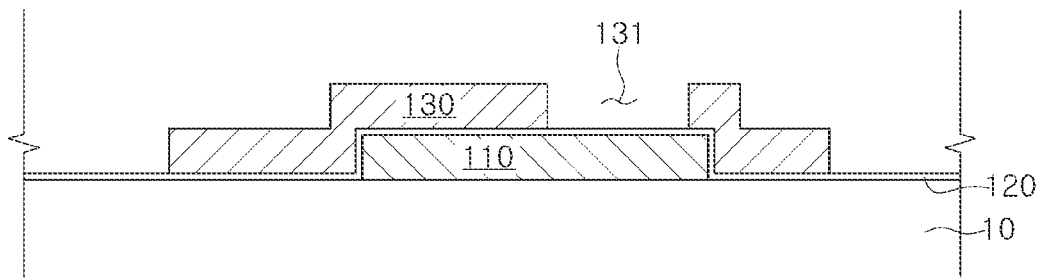

Referring to FIG. 7, the second electrode 130 may be formed on the surface of the first dielectric layer 120. The second electrode 130 may be formed to have a size larger than that of the first electrode 110 and may entirely cover the first electrode 110. At least one instance of a first groove portion 131 exposing the first dielectric layer 120 may be formed on a bottom surface of the second electrode 130 by etching a region of the second electrode 130 overlapping the first electrode 110. The second electrode 130 may be formed by depositing the same conductive material as that of the first electrode 110, but may be formed by depositing a conductive material different than that of the first electrode 110 in example embodiments.

Figure 8:
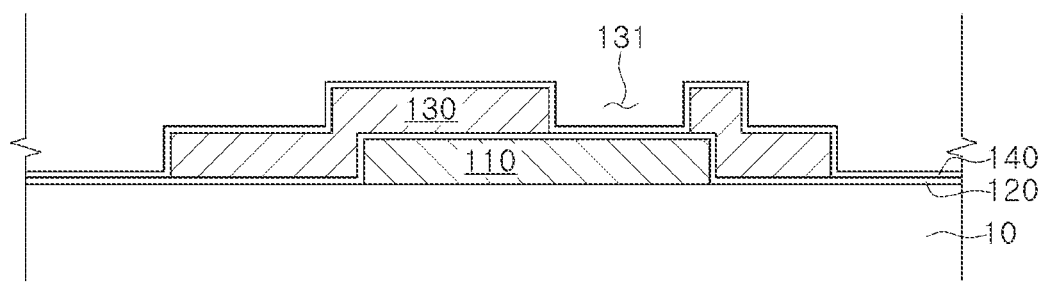

Referring to FIG. 8, the second dielectric layer 140 may be formed to cover the second electrode 130. The second dielectric layer 140 may be formed to cover an upper surface and a side surface of the second electrode 130. Accordingly, the second dielectric layer 140 may also be formed on the side surface and the bottom surface of the first groove portion 131. Similarly to the first dielectric layer 120, the second dielectric layer 140 may include silicon oxide, silicon nitride, silicon oxynitride, a high-K dielectric, or a combination thereof. The second dielectric layer 140 may be conformally formed on the second electrode 130 by a predetermined thickness. Accordingly, in a subsequent process of forming the third electrode 150, an exterior shape of the second electrode 130 may be transferred to the third electrode 150.

Figure 9:
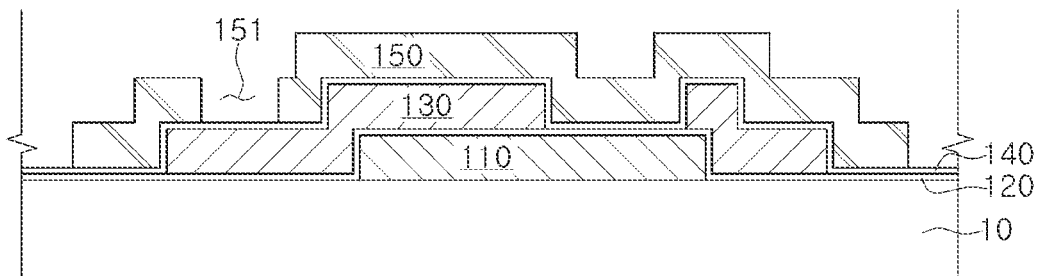

Referring to FIG. 9, the third electrode 150 may be formed to cover the surface of the second dielectric layer 140. The third electrode 150 may be formed to have a size larger than that of the second electrode 130 and may entirely cover the second electrode 130.

At least one instance of a one second groove portion 151 through which the second dielectric layer 140 is exposed may be formed on a bottom surface of the third electrode 150 by etching a region of the third electrode 150 overlapping the second electrode 130. The third electrode 150 may be formed by depositing the same conductive material as that of the first electrode 110 and the second electrode 130, but may be formed by depositing a conductive material different than that of the first electrode 110 and the second electrode 130 in example embodiments.

Figure 10:
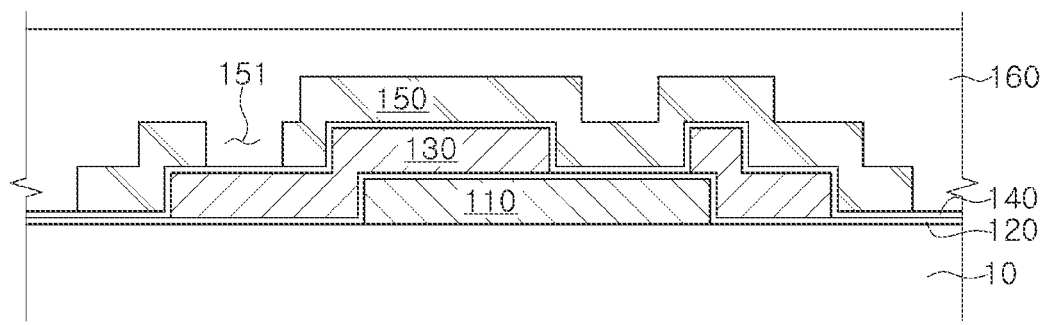

Referring to FIG. 10, a cover layer 160 may be formed to entirely cover the third electrode 150. The cover layer 160 may be formed by depositing a dielectric material, similarly to the first dielectric layer 120 and the second dielectric layer 140. The dielectric material may include silicon oxide, silicon nitride, silicon oxynitride, a high-k dielectric, or a combination thereof. The cover layer 160 may be planarized by performing a chemical mechanical polishing (CMP) process on the surface after applying a dielectric material to cover the third electrode 150.

Figure 11:
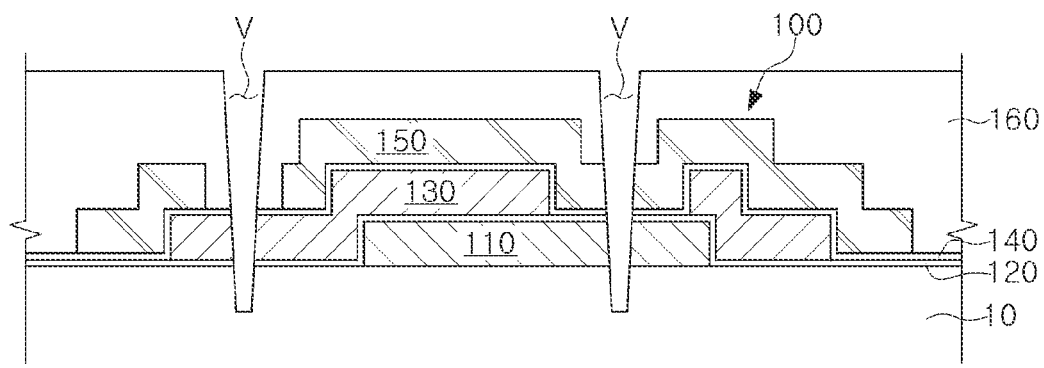

Referring to FIG. 11, a via hole V extending inwardly may be formed. The via hole V may be formed to extend from the surface of the cover layer 160 into the substrate 10.

Figure 12:
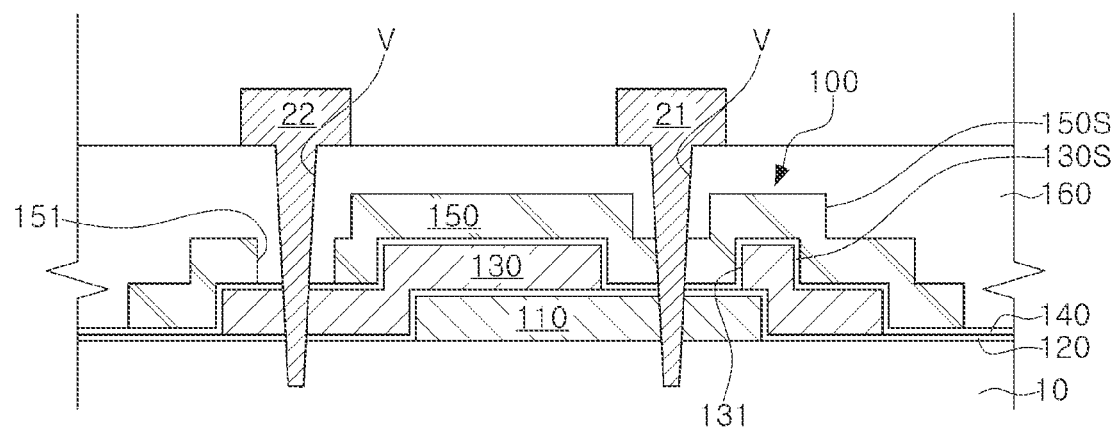

Referring to FIG. 12, the first via electrode 21 and the second via electrode 22 may be formed by filling the via hole V. The first via electrode 21 and the second via electrode 22 may be formed in a columnar shape filling the via hole V. The first via electrode 21 may be electrically connected to the first electrode 110 and the third electrode 150, and the second via electrode 22 may be electrically connected to the second electrode 130. Thereafter, a passivation layer 30 and a protective layer 40 may be formed to cover the first via electrode 21 and the second via electrode 22 and the cover layer 160, and a hole 50 penetrating through the passivation layer 30 and the protective layer 40 may be formed (see FIG. 1).

According to the aforementioned example embodiments, the upper electrode may cover the upper surface and the side surface of the lower electrode, such that damages to the lower electrode may be prevented in the manufacturing process, and a metal-insulator-metal capacitor having improved reliability and yield may be provided.

While the example embodiments have been illustrated and described above, it will be apparent to those skilled in the art that modifications and variations could be made without departing from the scope of the present disclosure as defined by the appended claims.

What is claimed is:

1. A metal-insulator-metal capacitor, comprising:
    a first electrode in contact with an upper surface of a substrate and disposed in a first region of the upper surface;
    a second electrode covering the first electrode and extending to a second region, the second region surrounding an outer periphery of the first region;
    a third electrode covering the second electrode and extending to a third region, the third region surrounding an outer periphery of the second region;
    a first dielectric layer disposed between the first electrode and the second electrode to cover an upper surface and a side surface of the first electrode and extending to the second region of the upper surface of the substrate; and
    a second dielectric layer disposed between the second electrode and the third electrode to cover an upper surface and a side surface of the second electrode and extending to the third region of the upper surface of the substrate and in contact with the first dielectric layer;
    wherein the first dielectric layer contacts an upper surface of the substrate and extends parallel to the upper surface of the substrate in the third region,
    wherein the second dielectric layer contacts an upper surface of the first dielectric layer and extends parallel to an upper surface of the first dielectric layer in the third region, and
    wherein the third electrode contacts an upper surface of the second dielectric layer in the third region.

2. The metal-insulator-metal capacitor of claim 1,
    wherein the first dielectric layer covers the upper surface and the side surface of the first electrode with a substantially uniform thickness, and
    wherein the second dielectric layer covers the upper surface and the side surface of the second electrode with a substantially uniform thickness.

3. The metal-insulator-metal capacitor of claim 1, wherein the second electrode includes at least one first groove portion disposed in the first region and penetrating through the second electrode.

4. The metal-insulator-metal capacitor of claim 3, wherein the third electrode includes at least one second groove portion disposed in the second region and penetrating through the third electrode.

5. The metal-insulator-metal capacitor of claim 4, further comprising:
    a first via electrode spaced apart from an internal side wall of the first groove portion, penetrating through the first groove portion, and in contact with the first electrode and the third electrode; and
    a second via electrode spaced apart from an internal side wall of the second groove portion, penetrating through the second groove portion, and in contact with the second electrode.

6. The metal-insulator-metal capacitor of claim 1, wherein an interior angle between the upper surface and the side surface of the first electrode is in a range of 90° to 135°.

7. The metal-insulator-metal capacitor of claim 6, wherein an interior angle between the upper surface and the side surface of the second electrode and an interior angle between the upper surface and the side surface of the first electrode have an angle difference of 0° to 10°.

8. The metal-insulator-metal capacitor of claim 1,
    wherein the first electrode, the second electrode and the third electrode include substantially the same conductive material, and
    wherein the same conductive material included in the first electrode, the second electrode and the third electrode includes at least one of aluminum (Al), copper (Cu), nickel (Ni), tungsten (W), platinum (Pt), and gold (Au).

9. The metal-insulator-metal capacitor of claim 1, wherein the first dielectric layer and the second dielectric layer both include the same dielectric material.

10. A metal-insulator-metal capacitor, comprising:
- a first electrode disposed on an upper surface of a substrate and disposed in a first region of the upper surface;
- a second electrode covering an upper surface and a side surface of the first electrode and extending to a second region, the second region surrounding the first region;
- a third electrode covering a side surface and an upper surface of the second electrode and extending to a third region, the third region surrounding the second region;
- a first dielectric layer interposed between the first electrode and the second electrode; and
- a second dielectric layer interposed between the second electrode and the third electrode,
- wherein the first dielectric layer contacts an upper surface of the substrate and extends parallel to the upper surface of the substrate in the third region,
- wherein the second dielectric layer contacts an upper surface of the first dielectric layer and extends parallel to an upper surface of the first dielectric layer in the third region,
- wherein the third electrode contacts an upper surface of the second dielectric layer in the third region, and
- wherein an interior angle between the upper surface and the side surface of each of the first electrode, the second electrode and the third electrode is in a range of 90° to 135°.

11. The metal-insulator-metal capacitor of claim 10, wherein an interior angle between the upper surface and the side surface of the second electrode and an interior angle between the upper surface and the side surface of the first electrode have an angle difference of 0° to 10°.

12. The metal-insulator-metal capacitor of claim 10,
- wherein the third electrode has a size larger than a size of the second electrode, and
- wherein the second electrode has a size larger than a size of the first electrode.

13. The metal-insulator-metal capacitor of claim 10, further comprising:
- a cover layer covering the third electrode.

14. The metal-insulator-metal capacitor of claim 1, wherein the second electrode extends to the second region without extending to the third region.

15. The metal-insulator-metal capacitor of claim 1, wherein only the third electrode among the first electrode, the second electrode, and the third electrode, is disposed in the third region.

* * * * *